US012761254B2

(12) United States Patent
Kumar et al.

(10) Patent No.: US 12,761,254 B2
(45) Date of Patent: Oct. 13, 2026

(54) SYSTEM AND METHOD FOR IDENTIFYING ANOMALOUS BEHAVIOR IN ELECTRICAL DEVICES PLUGGED INTO A SMART SOCKET

(71) Applicant: Honeywell International Inc., Charlotte, NC (US)

(72) Inventors: Kanhayia Kumar, Bangalore (IN); Rajiv R. Singh, Bangalore (IN); Nilesh Chaudhari, Bangalore (IN); Shyam Kumar Mohan Das, Rugby (GB); Chris Inkpen, Horsham (GB); Philip Anthony Barnett, Essex (GB); Bhupinder Heer, Harrow (GB); Rory Stewart Foxley, West (GB)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 165 days.

(21) Appl. No.: 18/750,560

(22) Filed: Jun. 21, 2024

(65) Prior Publication Data

US 2025/0389760 A1 Dec. 25, 2025

(51) Int. Cl.
*H01H 31/02* (2006.01)
*G01R 21/06* (2006.01)
(Continued)

(52) U.S. Cl.
CPC ............. *G01R 21/06* (2013.01); *G01R 21/14* (2013.01); *G01R 31/56* (2020.01)

(58) Field of Classification Search
CPC ......... G01R 21/06; G01R 21/14; G01R 21/56
See application file for complete search history.

(56) References Cited

U.S. PATENT DOCUMENTS 4,046,532 A 9/1977 Nelson
4,341,345 A 7/1982 Hammer et al.
(Continued)

FOREIGN PATENT DOCUMENTS

CN 103197138 A 7/2013
CN 104280243 A 1/2015
(Continued)

OTHER PUBLICATIONS

ABB, "White Paper-Predictive Maintenance Goes Mainstream", Memphis, TN, 5 pages, 2020.
(Continued)

*Primary Examiner* — Thang X Le
(74) *Attorney, Agent, or Firm* — Seager, Tufte & Wickhem, LLP

(57) ABSTRACT

Anomalous behavior of an appliance plugged into a smart socket may be identified. A baseline appliance profile is identified for the appliance plugged into the smart socket, based at least in part on the current and the voltage sampled at each of a plurality of sample times. An operational profile is identified based at least in part on the current and the voltage sampled during an operational time period. The operational profile of the appliance is compared to the baseline appliance profile, and an anomalous behavior in the operation of the appliance is detected and/or predicted based at least in part on the comparison of the operational profile of the appliance to the baseline appliance profile. Action may be taken in response to detecting and/or predicting the anomalous behavior in the operation of an appliance.

17 Claims, 10 Drawing Sheets

(51) Int. Cl.
*G01R 21/14* (2006.01)
*G01R 31/56* (2020.01)

(56) References Cited

U.S. PATENT DOCUMENTS

| | | | | |
|---|---|---|---|---|
| 4,345,162 | A | 8/1982 | Hammer et al. | |
| 4,389,577 | A | 6/1983 | Anderson et al. | |
| 4,577,977 | A | 3/1986 | Pejsa | |
| 4,644,320 | A | 2/1987 | Carr et al. | |
| 4,924,404 | A | 5/1990 | Reinke, Jr. | |
| 5,493,191 | A | 2/1996 | Phoy et al. | |
| 5,519,295 | A | 5/1996 | Jatnieks | |
| 5,598,349 | A | 1/1997 | Elliason et al. | |
| 6,249,100 | B1 | 6/2001 | Lange | |
| 6,552,525 | B2 | 4/2003 | Bessler | |
| 6,574,581 | B1 | 6/2003 | Bohrer et al. | |
| 6,838,978 | B2 | 1/2005 | Aizu et al. | |
| 6,931,445 | B2 | 8/2005 | Davis | |
| 6,975,958 | B2 | 12/2005 | Bohrer et al. | |
| 7,058,524 | B2 | 6/2006 | Hayes et al. | |
| 7,346,467 | B2 | 3/2008 | Bohrer et al. | |
| 7,379,997 | B2 | 5/2008 | Ehlers et al. | |
| 7,392,115 | B2 | 6/2008 | Schindler | |
| 7,603,222 | B2 | 10/2009 | Wiseman et al. | |
| 8,084,982 | B2 | 12/2011 | Grabinger et al. | |
| 8,838,413 | B2 | 9/2014 | Genta | |
| 8,996,188 | B2 | 3/2015 | Frader-Thompson et al. | |
| 9,372,482 | B2 | 6/2016 | Rikkola et al. | |
| 9,441,547 | B2 | 9/2016 | Cai et al. | |
| 9,465,059 | B2 * | 10/2016 | Dilly | H04B 3/54 |
| 9,766,638 | B2 | 9/2017 | Georgin | |
| 10,112,727 | B1 | 10/2018 | Cutler | |
| 10,909,240 | B2 | 2/2021 | Eltoft | |
| 11,614,721 | B2 | 3/2023 | Funes | |
| 12,253,548 | B2 * | 3/2025 | Corti | G01R 19/2513 |
| 2004/0030531 | A1 | 2/2004 | Miller et al. | |
| 2005/0060107 | A1 | 3/2005 | Rodenberg et al. | |
| 2006/0016201 | A1 | 1/2006 | Kopel | |
| 2007/0118270 | A1 | 5/2007 | Wiseman et al. | |
| 2007/0271006 | A1 | 11/2007 | Golden et al. | |
| 2008/0011864 | A1 | 1/2008 | Tessier et al. | |
| 2008/0027885 | A1 | 1/2008 | Van Putten et al. | |
| 2008/0228325 | A1 | 9/2008 | Schindler | |
| 2008/0238406 | A1 | 10/2008 | Banhegyesi | |
| 2009/0001180 | A1 | 1/2009 | Siddaramanna et al. | |
| 2009/0001181 | A1 | 1/2009 | Siddaramanna et al. | |
| 2009/0001182 | A1 | 1/2009 | Siddaramanna et al. | |
| 2009/0045804 | A1 | 2/2009 | Durling et al. | |
| 2009/0195349 | A1 | 8/2009 | Frader-Thompson et al. | |
| 2009/0312969 | A1 | 12/2009 | Sundaresh et al. | |
| 2010/0123421 | A1 | 5/2010 | Grabinger et al. | |
| 2011/0076131 | A1 | 3/2011 | Stabley et al. | |
| 2012/0290261 | A1 | 11/2012 | Genta | |
| 2012/0323510 | A1 * | 12/2012 | Bell | H02J 3/14 702/62 |
| 2014/0277764 | A1 | 9/2014 | Burt | |
| 2015/0007713 | A1 | 1/2015 | Aki | |
| 2015/0323928 | A1 | 11/2015 | Mm et al. | |
| 2016/0274161 | A1 * | 9/2016 | Jeon | G01R 21/00 |
| 2017/0152862 | A1 | 6/2017 | Houst et al. | |
| 2017/0293293 | A1 | 10/2017 | Brownie et al. | |
| 2020/0208862 | A1 | 7/2020 | Mikulica et al. | |
| 2021/0223769 | A1 | 7/2021 | Khalate et al. | |
| 2021/0288450 | A1 * | 9/2021 | Davies | H01R 13/6683 |
| 2025/0044329 | A1 * | 2/2025 | Payne | G01R 21/133 |
| 2025/0210920 | A1 * | 6/2025 | Parfitt | G08B 17/06 |

FOREIGN PATENT DOCUMENTS

| | | |
|---|---|---|
| CN | 109656208 B | 9/2020 |
| CN | 111649449 A | 9/2020 |

OTHER PUBLICATIONS

Castangia et al., "Detection of Anamolies in Household Appliances from Disaggregated Load Consumption," International Conference on Smart Energy Systems and Technologies, 2021. 6 pages. Downloaded on Oct. 30, 2023 from IEEE Xplore.

Ecobee, "Meet the Ecobee Smart Thermostat," Sales Sheet, 2 pages, prior to Jun. 16, 2009.

Ecobee, Screenshot of Ecobee Web Site Window, Captured prior to Jun. 16, 2009.

Ecobee, Smart Installation Manual, pp. 1-26, 2009.

Ecobee, Smart Thermostat User Manual, pp. 1-32, 2009.

http://www.ecobee.com/productspecifications, "Programmable Thermostats and Other Green Living Products--Specifications," 2 pages, 2009.

Infineon Technologies, "Predictive Maintenance and Condition Monitoring," 17 pages, Downloaded Sep. 14, 2023.

Xiamoi Smart Plug 2, (Wi-Fi), Overview, 1 pages, 2023.

* cited by examiner

SYSTEM AND METHOD FOR IDENTIFYING ANOMALOUS BEHAVIOR IN ELECTRICAL DEVICES PLUGGED INTO A SMART SOCKET

TECHNICAL FIELD

The present disclosure relates generally to smart sockets. More particularly, the present disclosure relates to identifying anomalous behavior in electrical devices plugged into smart sockets.

BACKGROUND

Smart sockets are increasingly being used to power a variety of different electrical devices, including appliances. Electrical devices such as appliances do not last forever, and can break down. Monitoring a smart socket can provide information regarding the relative health of the electrical device that is plugged into an outlet receptacle of the smart socket and that is being powered by the smart socket. As an example, an appliance that slowly increases its current draw over time may be failing, and may need maintenance or replacement. An appliance that exhibits a rapid increase in current draw may be failing, and moreover may represent a fire risk. What would be desirable are systems and methods for learning a normal behavior profile of various electrical devices such as appliances, so that the behavior of a particular electrical device may be compared to a corresponding normal behavior profile to quickly identify potentially anomalous behavior of the electrical device, and in some cases, take action.

SUMMARY

The present disclosure relates generally to smart sockets, and more particularly to identifying anomalous behavior in electrical devices plugged into such smart sockets. An example may be found in a method for identifying anomalous behavior in an operation of an appliance that is plugged into a socket receptacle of a smart socket, wherein the smart socket includes a measurement unit that is configured to sample at least a current and a voltage delivered by the smart socket to the appliance. The illustrative method includes, during a learning time, identifying a baseline appliance profile for the appliance that is plugged into the socket receptacle of the smart socket. The baseline appliance profile is based at least in part on the current and the voltage, sampled by the measurement unit of the smart socket at each of a plurality of sample times during the learning time, and delivered by the smart socket to the appliance. The illustrative method also includes an operational time that is subsequent to the learning time. The operational time includes identifying an operational profile for the appliance that is based at least in part on the current and the voltage, sampled by the measurement unit of the smart socket at each of a plurality of sample times during the operational time, and delivered by the smart socket to the appliance. The operational profile of the appliance may be compared to the baseline appliance profile, and based on the comparison, an anomalous behavior in the operation of the appliance may be detected and/or predicted. The illustrative method may include taking action in response to detecting and/or predicting an anomalous behavior in the operation of an appliance, such as notifying an operator and/or turning off power to the appliance via the smart socket.

Another example may be found in a method for identifying anomalous behavior in an operation of an appliance that is plugged into a socket receptacle of a smart socket, wherein the smart socket includes a measurement unit that is configured to sample one or more of voltage, current, power, and energy delivered by the smart socket to the appliance. This illustrative method includes a learning time and an operation time. The learning time includes monitoring one or more of voltage, current, power, and energy that is sampled by the measurement unit of the smart socket and delivered by the smart socket to the appliance that is plugged into the socket receptacle of the smart socket during at least part of the learning time, resulting in a monitored electrical behavior of the appliance. Based on the monitored electrical behavior of the appliance, the appliance may be classified into one of a plurality of predetermined appliance types, wherein each of the plurality of predetermined appliance types has a corresponding predefined baseline appliance profile. During at least part of the operational time, one or more of voltage, current, power, and energy that is sampled by the measurement unit of the smart socket and delivered by the smart socket to the appliance that is plugged into the socket receptacle of the smart socket is monitored, resulting in a monitored operational behavior. The monitored operational behavior of the appliance is compared with the predefined baseline appliance profile that corresponds to the predetermined appliance type into which the appliance has been classified, and an anomalous behavior in the appliance is detected and/or predicted based at least in part on the comparison of the monitored operational behavior of the appliance with the predefined baseline appliance profile that corresponds to the predetermined appliance type into which the appliance has been classified. The illustrative method may include taking action in response to detecting and/or predicting the anomalous behavior in the operation of an appliance, such as notifying an operator and/or turning off power to the appliance via the smart socket.

Another example may be found in a system for identifying anomalous behavior in an operation of an appliance that is plugged into a socket receptacle of a smart socket, wherein the smart socket includes a measurement unit that is configured identify an energy use of the appliance delivered by the smart socket to the appliance. The illustrative system includes a memory for storing the identified energy use of the appliance delivered by the smart socket to the appliance and a controller that is operatively coupled to the memory. The controller is configured to detect an energy use pattern of the appliance based on the stored energy use identified by the measurement unit of the smart socket and compare the energy use pattern to an expected energy use pattern for the appliance. When the energy use pattern deviates from the expected energy use pattern for the appliance in accordance with one or more predetermined deviation criteria, the controller is configured to detect and/or predict an anomalous behavior in an operation of an appliance. The controller is configured to take action in response to detecting and/or predicting the anomalous behavior in the operation of an appliance, such as notifying an operator and/or turning off power to the appliance via the smart socket.

The preceding summary is provided to facilitate an understanding of some of the innovative features unique to the present disclosure and is not intended to be a full description. A full appreciation of the disclosure can be gained by taking the entire specification, claims, figures, and abstract as a whole.

BRIEF DESCRIPTION OF THE FIGURES

The disclosure may be more completely understood in consideration of the following description of various examples in connection with the accompanying drawings, in which.

Figure 1:
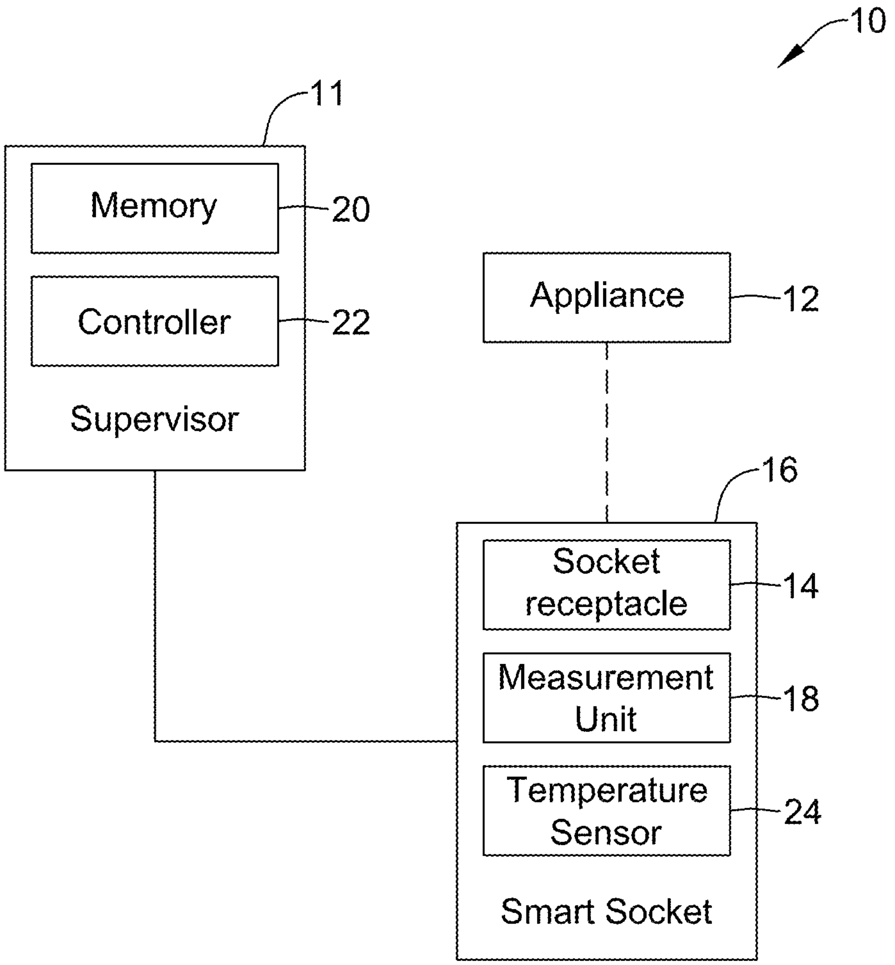
FIG. 1 is a schematic block diagram showing an illustrative system for identifying anomalous behavior in an appliance.

While the disclosure is amenable to various modifications and alternative forms, specifics thereof have been shown by way of example in the drawings and will be described in detail. It should be understood, however, that the intention is not to limit the disclosure to the particular examples described. On the contrary, the intention is to cover all modifications, equivalents, and alternatives falling within the spirit and scope of the disclosure.

DESCRIPTION

The following description should be read with reference to the drawings, in which like elements in different drawings are numbered in like fashion. The drawings, which are not necessarily to scale, depict examples that are not intended to limit the scope of the disclosure. Although examples are illustrated for the various elements, those skilled in the art will recognize that many of the examples provided have suitable alternatives that may be utilized.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram showing an illustrative system 10 for identifying anomalous behavior in an operation of an appliance 12 that is plugged into a socket receptacle 14 of a smart socket 16. The smart socket 16 includes a measurement unit 18 that is configured to identify energy use of the appliance 12, where the energy is delivered to the appliance 12 by the smart socket 16. In some cases, the measurement unit 18 may be configured to measure or otherwise sample both a current and a voltage of the electrical energy delivered to the appliance 12 by the smart socket 16. In some cases, the measurement unit 18 may be configured to measure or otherwise sample power and/or the power factor that is delivered to the appliance 12 by the smart socket 16. In some cases, the measurement unit 18 may be configured to measure or otherwise sample temperature in the smart socket. These are just examples.

The smart socket 16 may be wirelessly connected as part of a mesh network, for example, that allows each of a number of smart sockets 16 to communicate with each other and/or with a supervisor 11. In some cases, the supervisor 11 may be a hub device that is operatively coupled to a remote cloud server (not shown), wherein each hub device is assigned to a plurality of smart sockets 16. In some cases, the supervisor 11 is the remote cloud server. In some cases, the supervisor 11 includes a hub device that is operatively coupled to a remote cloud server, and the supervisory function is distributed between the hub device and the remote cloud server. In some cases, part of all of the supervisor 11 is included within the smart socket 16.

In some cases, the measurement unit 18 of the smart socket 16 may be configured to report to the supervisor 11 one or more measures derived at least in part from the current and/or the voltage sampled by the measurement unit 18 at one or more of the plurality of sample times during a learning time, and one or more measures derived at least in part from the current and/or the voltage sampled by the measurement unit 18 at one or more of the plurality of sample times during an operational time.

The illustrative supervisor 11 includes a memory 20 for storing the identified energy use of the appliance 12 that is delivered by the smart socket 16 to the appliance 12. The illustrative supervisor 11 further includes a controller 22 that is operatively coupled to the memory 20. The controller 22 is configured to detect an energy use pattern of the appliance 12 based on the stored energy use identified by the measurement unit 18 of the smart socket 16 and to compare the energy use pattern to an expected energy use pattern for the appliance 12. When the energy use pattern deviates from the expected energy use pattern for the appliance 12 in accordance with one or more predetermined deviation criteria, the controller 22 is configured to detect and/or predict an anomalous behavior in an operation of an appliance 12. In some cases, the controller 22 is also configured to take action in response to detecting and/or predicting the anomalous behavior in the operation of the appliance 12, such as notify an operator and/or turn off power to the appliance via the smart socket 16.

In some cases, the controller 22 may be configured to classify the appliance 12 into a selected one of a plurality of appliance types based at least in part on the energy use pattern of the appliance 12, wherein each of the plurality of appliance types has a corresponding expected energy use pattern. The controller 22 may be configured to compare the current energy use pattern of the appliance 12 to the corresponding expected energy use pattern for the corresponding one of the plurality of appliance types. As an example, the plurality of appliance types may include one or more of a clothes dryer, a clothes washer, a dishwasher, a light, a television, a freezer, a refrigerator, a garage door opener, a computer, a modem, and a printer.

In some cases, the measurement unit 18 of the smart socket 16 may be configured to report one or more measures derived at least in part from the current and/or the voltage sampled by the measurement unit 18 at one or more of the plurality of sample times during a learning time, and one or more measures derived at least in part from the current and/or the voltage sampled by the measurement unit 18 at one or more of the plurality of sample times during an operational time. In some cases, the controller 22 may be configured to transmit an alert to notify a user of the detected and/or predicted anomalous behavior in the operation of the appliance 12. In some instances, in response to the detected and/or predicted anomalous behavior in the operation of the appliance 12, the controller 22 may be configured to instruct the smart socket 16 to turn off power to the socket receptacle 14 of the smart socket 16 and thus turn power off to the appliance 12 that is plugged into the socket receptacle 14 of the smart socket 16.

In some cases, the smart socket 16 may include an in-built temperature sensor 24 that is configured to sample a temperature inside the smart socket 16. In some cases, the baseline appliance profile may include a baseline temperature profile that is based at least in part on the temperature inside the smart socket 16 at each of a plurality of temperature sample times during the learning time correlated with the current and the voltage sampled by the measurement unit 18 at one or more of the plurality of sample times during the learning time. In some cases, the operational profile may be based at least in part on the current and the voltage, sampled by the measurement unit 18 at each of a plurality of sample times during the operational time as well as an operational temperature profile that is based at least in part on the temperature inside the smart socket 16 at each of a plurality of temperature sample times during the operational time and correlated with the current and the voltage sampled by the measurement unit 18 at one or more of the plurality of sample times during the operational time. In some cases, the controller 22 may be configured to detect and/or predict the anomalous behavior in the operation of the appliance 12 by comparing the operational temperature profile, correlated with the current and the voltage sampled by the measurement unit 18 at one or more of the plurality of sample times during the operational time, to the baseline temperature profile of the baseline appliance profile.

In some instances, the controller 22 may be configured to identify a baseline appliance profile for the appliance 12 during a learning time. The baseline appliance profile may be based at least in part on or derived from the current and the voltage that is sampled by the measurement unit 18 of the smart socket 16 at each of a plurality of sample times during the learning time, and delivered by the smart socket 16 to the appliance 12. During a subsequent operational time, the controller 22 may be configured to identify an operational profile for the appliance 12 that is based at least in part on or derived from the current and the voltage that is sampled by the measurement unit 18 at each of a plurality of sample times during the operational time, and delivered by the smart socket 16 to the appliance 12. The controller 22 may be configured to compare the operational profile of the appliance to the baseline appliance profile and to detect and/or predict an anomalous behavior in the operation of the appliance 12 based at least in part on the comparison of the operational profile of the appliance 12 to the baseline appliance profile.

In some instances, the controller 22 may be configured to determine a baseline energy consumption profile of the appliance 12 that is plugged into the socket receptacle 14 of the smart socket 16 based at least in part on or derived from the current and the voltage, as sampled by the measurement unit 18 at one or more of the plurality of sample times during the learning time, wherein the baseline appliance profile includes the baseline energy consumption profile of the appliance 12. In some cases, the measurement unit 18 of the smart socket may derive and directly report to the supervisor 11 energy consumption, power consumption, power factor and/or other electrical load parameters sampled at one or more of the sample times.

The controller 22 may be configured to determine an operational energy consumption profile of the appliance 12 based at least in part on the current and the voltage (and/or other electrical load parameter) as sampled by the measurement unit 18 at one or more of the plurality of sample times during the operational time. The controller 22 may be configured to detect and/or predict the anomalous behavior in the operation of the appliance 12 based at least in part on the comparison of the operational energy consumption profile of the appliance 12 to the baseline energy consumption profile of the appliance 12.

In some instances, the controller 22 may be configured to determine a baseline power consumption profile of the appliance 12 that is plugged into the socket receptacle 14 of the smart socket 16 based at least in part on the current and the voltage (and/or other electrical load parameter) as sampled by the measurement unit 18 at one or more of the plurality of sample times during the learning time, wherein the baseline appliance profile includes the baseline power consumption profile of the appliance 12. The controller 22 may be configured to determine an operational power consumption profile of the appliance 12 based at least in part on the current and the voltage (and/or other electrical load parameter) as sampled by the measurement unit 18 at one or more of the plurality of sample times during the operational time. The controller 22 may be configured to detect and/or predict the anomalous behavior in the operation of the appliance based at least in part on the comparison of the operational power consumption profile of the appliance 12 to the baseline power consumption profile of the appliance 12.

In some instances, the controller 22 may be configured to determine a baseline power factor profile of the appliance 12 that is plugged into the socket receptacle 14 of the smart socket 16 based at least in part on the current and the voltage (and/or other electrical load parameter) as sampled by the measurement unit 18 at one or more of the plurality of sample times during the learning time, wherein the baseline appliance profile includes a baseline power factor profile of the appliance 12. The controller 22 may be configured to determine an operational power factor profile of the appliance based at least in part on the current and the voltage (and/or other electrical load parameter) as sampled by the measurement unit 18 at one or more of the plurality of sample times during the operational time. The controller 22 may be configured to detect and/or predict the anomalous behavior in the operation of the appliance 12 based at least in part on the comparison of the operational power factor profile of the appliance 12 to the baseline power factor profile of the appliance 12.

In some instances, the controller 22 may be configured to classify the appliance 12 that is plugged into the socket receptacle 14 of the smart socket 16 into one of a plurality of predetermined appliance types, wherein classifying the appliance 12 includes comparing the current and/or the voltage (and/or other electrical load parameter) sampled by the measurement unit 18 at one or more of the plurality of sample times during a learning time with each of a plurality of predetermined appliance profiles associated with one of a plurality of predetermined appliance types to identifying a matching one of the plurality of predetermined appliance profiles. The controller 22 may be configured to use the matching one of the plurality of predetermined appliance profiles as the baseline appliance profile for the appliance that is plugged into the socket receptacle of the smart socket. In some case, each of the plurality of predetermined appliance profiles may be learned via machine learning using a large set of current and/or voltage (and/or other electrical load parameter) data captured from known appliances across each of the plurality of predetermined appliance types.

In some cases, the baseline appliance profile may include a power consumption signature of the appliance 12 that is plugged into the socket receptacle 14 of the smart socket 16. The baseline appliance profile may include an energy consumption signature of the appliance 12 that is plugged into the socket receptacle 14 of the smart socket 16. In some cases, the baseline appliance profile may include a power factor signature of the appliance that is plugged into the socket receptacle of the smart socket. These are just examples.

Figure 2A:
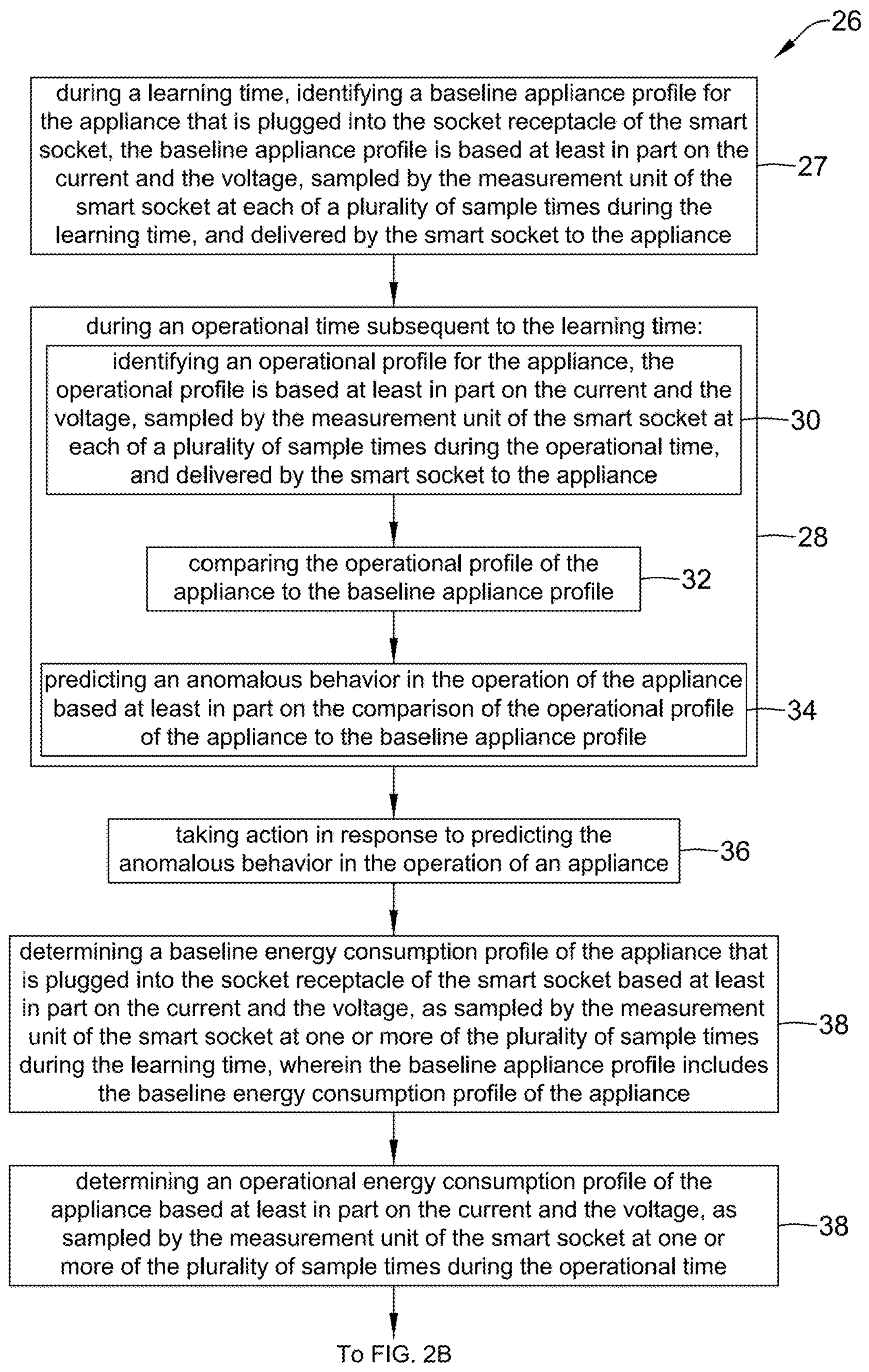
FIGS. 2A, 2B and 2C are flow diagrams that together show an illustrative method for identifying anomalous behavior in an appliance.
Figure 2B:
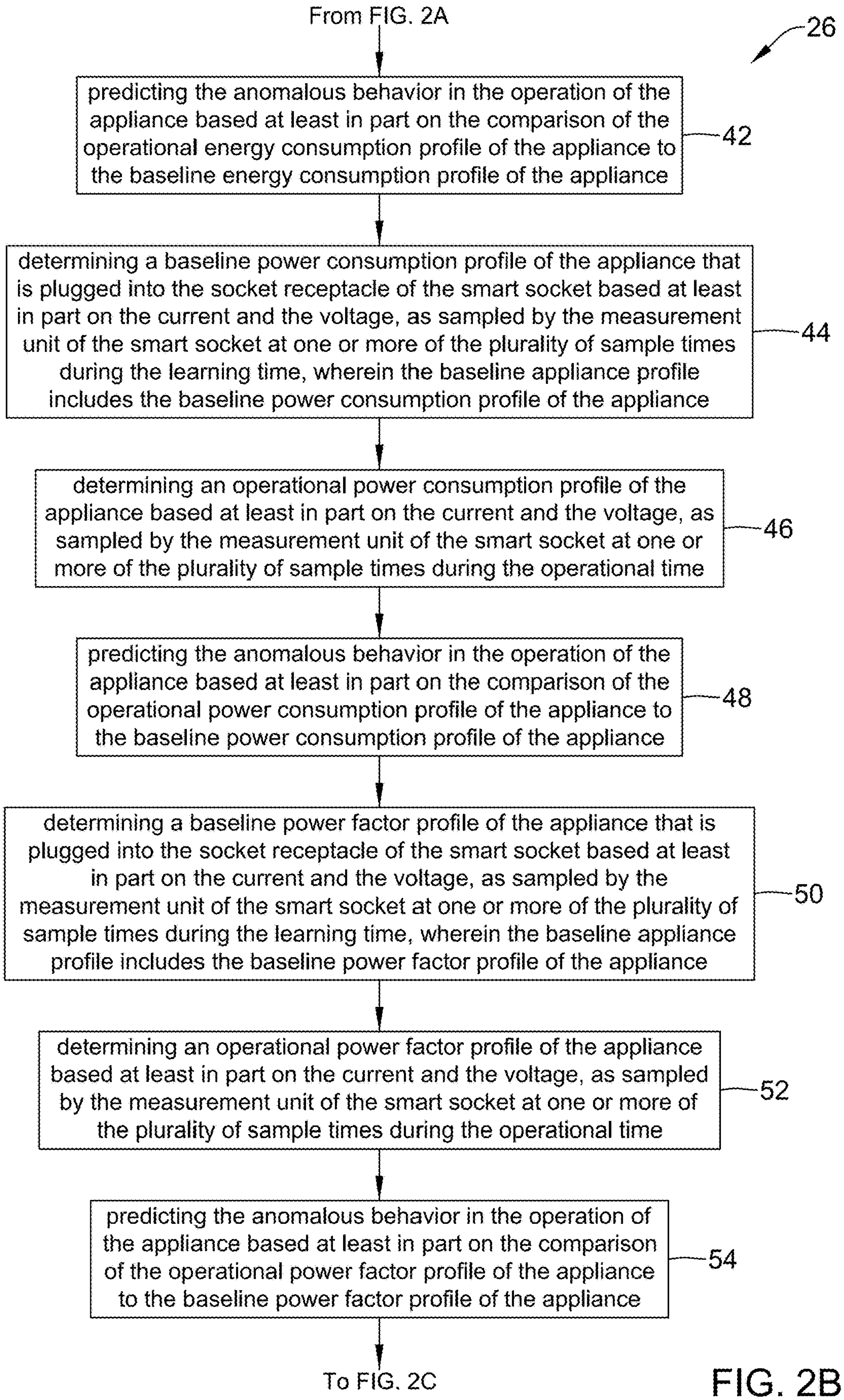
Figure 2C:
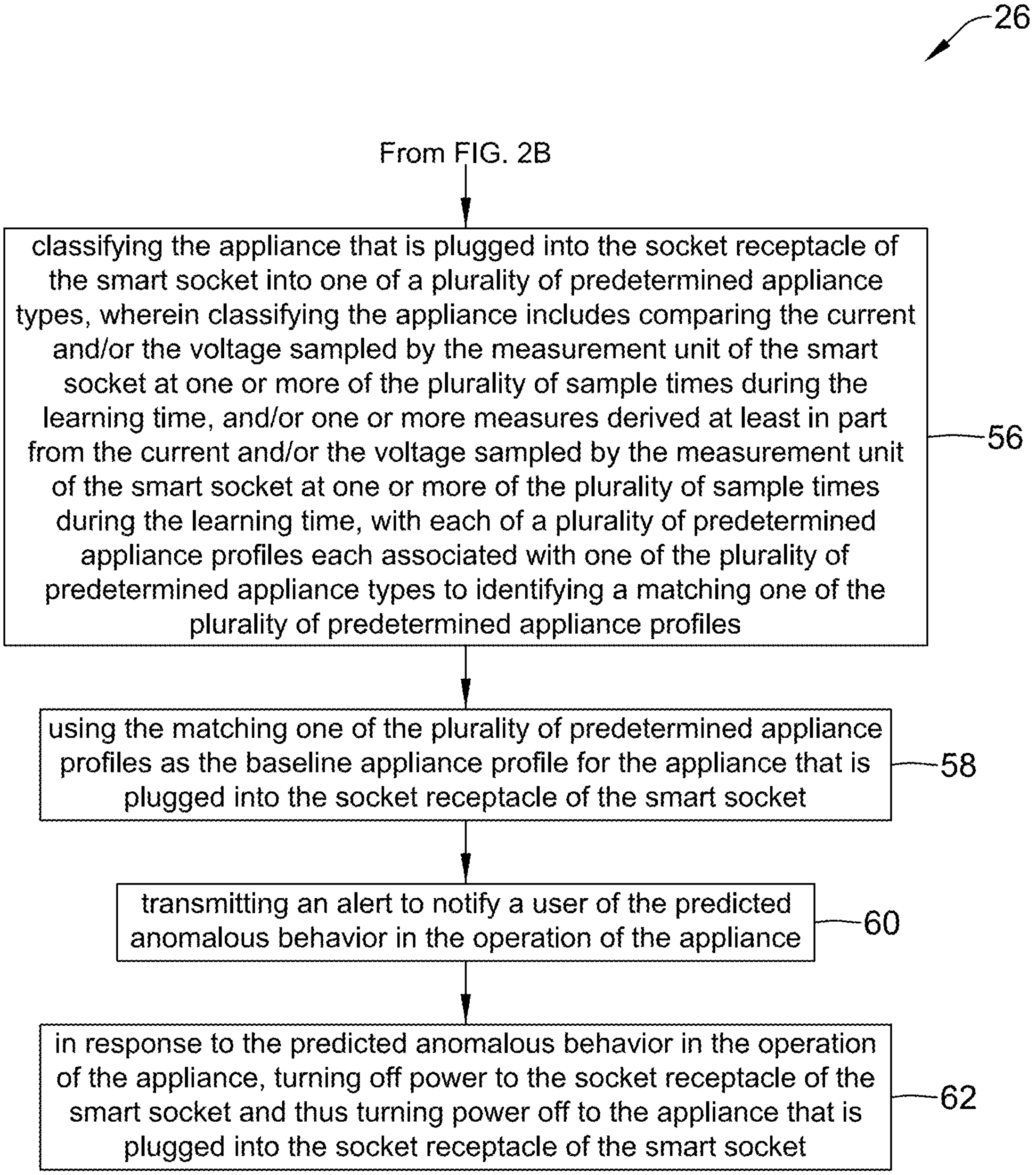

FIGS. 2A, 2B and 2C are flow diagrams that together show an illustrative method 26 for identifying anomalous behavior in an operation of an appliance (such as the appliance 12) that is plugged into a socket receptacle (such as the socket receptacle 14) of a smart socket (such as the smart socket 16), wherein the smart socket includes a measurement unit (such as the measurement unit 18) that is configured to sample a current and a voltage (and/or other electrical load parameter) delivered by the smart socket to the appliance. The illustrative method 26 includes, during a learning time, identifying a baseline appliance profile for the appliance that is plugged into the socket receptacle of the smart socket, the baseline appliance profile is based at least in part on the current and the voltage (and/or other electrical load parameter), sampled by the measurement unit of the smart socket at each of a plurality of sample times during the learning time, and delivered by the smart socket to the appliance, as indicated at block 27. The illustrative method 26 includes a subsequent operational time, as indicated at block 28. During the subsequent operational time, the method 26 includes identifying an operational profile for the appliance, the operational profile is based at least in part on the current and the voltage (and/or other electrical load parameter), sampled by the measurement unit of the smart socket at each of a plurality of sample times during the operational time, and delivered by the smart socket to the appliance, as indicated at block 30. During the operational time, the illustrative method 26 includes comparing the operational profile of the appliance to the baseline appliance profile, as indicated at block 32. The illustrative method 26 includes detecting and/or predicting an anomalous behavior in the operation of the appliance based at least in part on the comparison of the operational profile of the appliance to the baseline appliance profile, as indicated at block 34. The method 26 includes taking action in response to detecting and/or predicting the anomalous behavior in the operation of an appliance, as indicated at block 36.

In some cases, the smart socket may include an in-built temperature sensor for sampling a temperature inside the smart socket, and the baseline appliance profile may include a baseline temperature profile that is based at least in part on the temperature inside the smart socket at each of a plurality of temperature sample times during the learning time correlated with the current and the voltage sampled by the measurement unit of the smart socket at one or more of the plurality of sample times during the learning time. In some cases, the temperature inside the smart socket may depend on the load delivered to the appliance 12, and thus may be considered an electrical load parameter. In some cases, the operational profile may be based at least in part on or derived from the current and the voltage, sampled by the measurement unit of the smart socket at each of a plurality of sample times during the operational time, and delivered by the smart socket to the appliance, and an operational temperature profile that is based at least in part on the temperature inside the smart socket at each of a plurality of temperature sample times during the operational time and correlated with the current and the voltage sampled by the measurement unit of the smart socket at one or more of the plurality of sample times during the operational time. The anomalous behavior in the operation of the appliance may be detected and/or predicted by comparing the operational temperature profile, correlated with the current and the voltage (or other parameter(s) derived from the current and voltage) sampled by the measurement unit of the smart socket at one or more of the plurality of sample times during the operational time, to the baseline temperature profile of the baseline appliance profile.

In some instances, the illustrative method 26 may include determining a baseline energy consumption profile of the appliance that is plugged into the socket receptacle of the smart socket based at least in part on the current and the voltage (and/or other electrical load parameter), as sampled by the measurement unit of the smart socket at one or more of the plurality of sample times during the learning time, wherein the baseline appliance profile includes the baseline energy consumption profile of the appliance, as indicated at block 36. The method 26 may further include determining an operational energy consumption profile of the appliance based at least in part on the current and the voltage (and/or other electrical load parameter), as sampled by the measurement unit of the smart socket at one or more of the plurality of sample times during the operational time, as indicated at block 38. In some cases, and continuing on FIG. 2B, the illustrative method 26 may include detecting and/or predicting the anomalous behavior in the operation of the appliance based at least in part on the comparison of the operational energy consumption profile of the appliance to the baseline energy consumption profile of the appliance, as indicated at block 42.

In some instances, the method 26 may include determining a baseline power consumption profile of the appliance that is plugged into the socket receptacle of the smart socket based at least in part on the current and the voltage (and/or other electrical load parameter), as sampled by the measurement unit of the smart socket at one or more of the plurality of sample times during the learning time, wherein the baseline appliance profile includes the baseline power consumption profile of the appliance, as indicated at block 44. An operational power consumption profile of the appliance may be determined based at least in part on the current and the voltage (and/or other electrical load parameter), as sampled by the measurement unit of the smart socket at one or more of the plurality of sample times during the operational time, as indicated at block 46. The anomalous behavior in the operation of the appliance may be detected and/or predicted based at least in part on the comparison of the operational power consumption profile of the appliance to the baseline power consumption profile of the appliance, as indicated at block 48.

In some instances, the illustrative method 26 may include determining a baseline power factor profile of the appliance that is plugged into the socket receptacle of the smart socket based at least in part on the current and the voltage (and/or other electrical load parameter), as sampled by the measurement unit of the smart socket at one or more of the plurality of sample times during the learning time, wherein the baseline appliance profile includes the baseline power factor profile of the appliance, as indicated at block 50. An operational power factor profile of the appliance may be determined based at least in part on the current and the voltage (and/or other electrical load parameter), as sampled by the measurement unit of the smart socket at one or more of the plurality of sample times during the operational time, as indicated at block 52. The anomalous behavior in the operation of the appliance may be detected and/or predicted based at least in part on the comparison of the operational power factor profile of the appliance to the baseline power factor profile of the appliance, as indicated at block 54.

Continuing on FIG. 2C, the illustrative method 26 may include classifying the appliance that is plugged into the socket receptacle of the smart socket into one of a plurality of predetermined appliance types, wherein classifying the appliance includes comparing the current and/or the voltage (and/or other electrical load parameter) sampled by the measurement unit of the smart socket at one or more of the plurality of sample times during the learning time, and/or one or more measures derived at least in part from the current and/or the voltage sampled by the measurement unit of the smart socket at one or more of the plurality of sample times during the learning time, with each of a plurality of predetermined appliance profiles each associated with one of the plurality of predetermined appliance types to identifying a matching one of the plurality of predetermined appliance profiles, as indicated at block 56. The matching one of the plurality of predetermined appliance profiles may be used as the baseline appliance profile for the appliance that is plugged into the socket receptacle of the smart socket, as indicated at block 58.

In some cases, each of the plurality of predetermined appliance profiles may be learned using machine learning. In some cases, the baseline appliance profile may include a power consumption signature of the appliance that is plugged into the socket receptacle of the smart socket. In some cases, the baseline appliance profile may include an energy consumption signature of the appliance that is plugged into the socket receptacle of the smart socket. In some cases, the baseline appliance profile may include a power factor signature of the appliance that is plugged into the socket receptacle of the smart socket. In some cases, the measurement unit of the smart socket may be configured to report one or more measures derived at least in part from the current and/or the voltage (and/or other electrical load parameter) sampled by the measurement unit of the smart socket at one or more of the plurality of sample times during the learning time, and one or more measures derived at least in part from the current and/or the voltage (and/or other electrical load parameter) sampled by the measurement unit of the smart socket at one or more of the plurality of sample times during the operational time.

In some instances, the illustrative method 26 may include transmitting an alert to notify a user of the detected and/or predicted anomalous behavior in the operation of the appliance, as indicated at block 60. In some cases, and in response to the detected and/or predicted anomalous behavior in the operation of the appliance, the illustrative method 26 may include turning off power to the socket receptacle of the smart socket and thus turning power off to the appliance that is plugged into the socket receptacle of the smart socket, as indicated at block 62.

Figure 3:
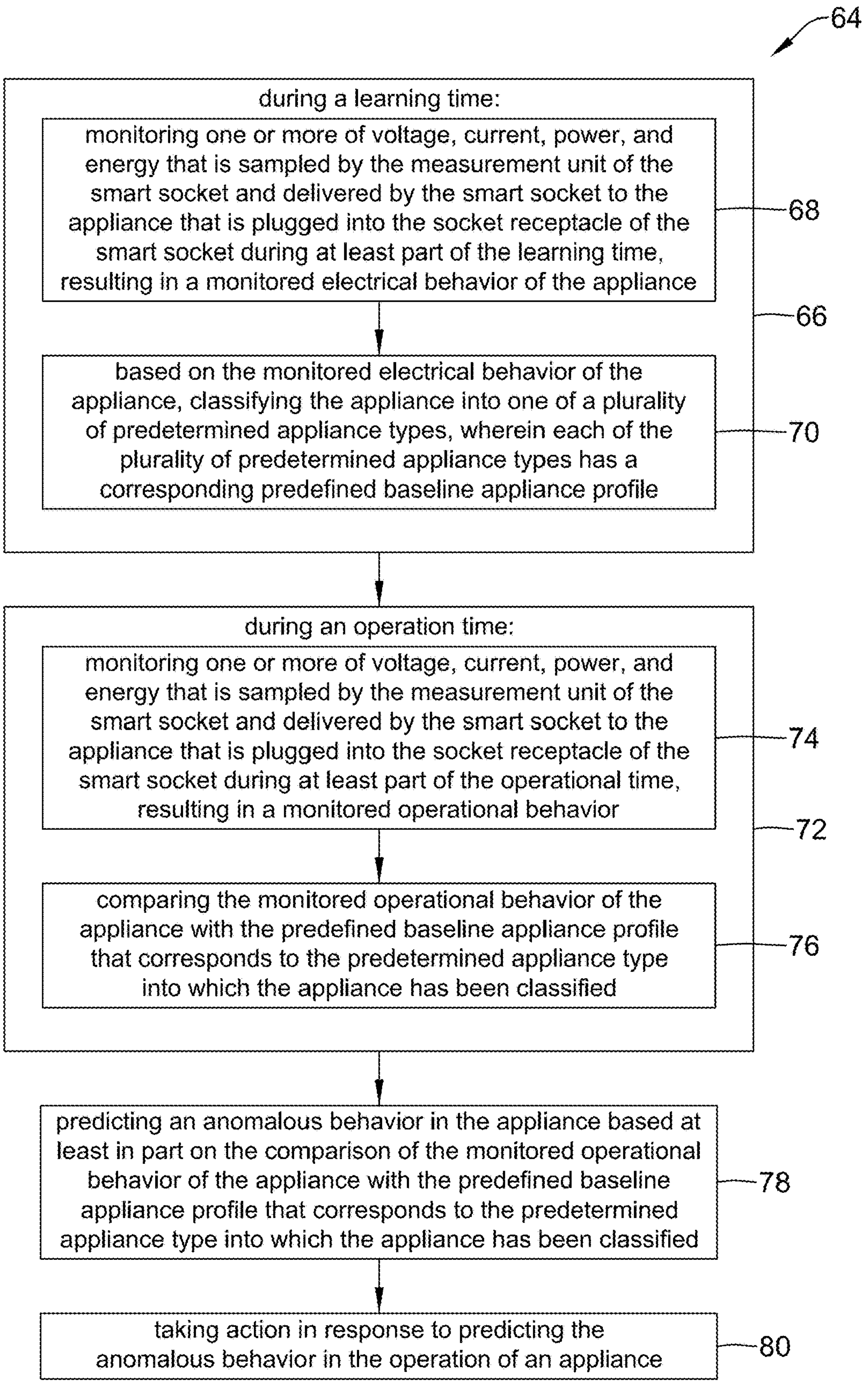
FIG. 3 is a flow diagram showing an illustrative method for identifying anomalous behavior in an appliance.

FIG. 3 is a flow diagram showing an illustrative method 64 for identifying anomalous behavior in an operation of an appliance (such as the appliance 12) that is plugged into a socket receptacle (such as the socket receptacle 14) of a smart socket (such as the smart socket 16), wherein the smart socket includes a measurement unit (such as the measurement unit 18) that is configured to sample one or more of voltage, current, power, and energy (and/or other electrical load parameter) delivered by the smart socket to the appliance. The illustrative method 64 includes a learning time, as indicated at block 66. During the learning time, the method 64 includes monitoring one or more of voltage, current, power, and energy (and/or other electrical load parameter) that is sampled by the measurement unit of the smart socket and delivered by the smart socket to the appliance that is plugged into the socket receptacle of the smart socket during at least part of the learning time, resulting in a monitored electrical behavior of the appliance, as indicated at block 68. Based on the monitored electrical behavior of the appliance, the method includes classifying the appliance into one of a plurality of predetermined appliance types, wherein each of the plurality of predetermined appliance types has a corresponding predefined baseline appliance profile, as indicated at block 70.

The illustrative method 64 includes an operation time, as indicated at block 72. During the operation time, the method 64 includes monitoring one or more of voltage, current, power, and energy (and/or other electrical load parameter) that is sampled by the measurement unit of the smart socket and delivered by the smart socket to the appliance that is plugged into the socket receptacle of the smart socket during at least part of the operational time, resulting in a monitored operational behavior, as indicated at block 74. The method 64 includes comparing the monitored operational behavior of the appliance with the predefined baseline appliance profile that corresponds to the predetermined appliance type into which the appliance has been classified, as indicated at block 76.

In some cases, the method 64 includes detecting and/or predicting an anomalous behavior in the appliance based at least in part on the comparison of the monitored operational behavior of the appliance with the predefined baseline appliance profile that corresponds to the predetermined appliance type into which the appliance has been classified, as indicated at block 78. The method 64 includes taking action in response to detecting and/or predicting the anomalous behavior in the operation of an appliance, as indicated at block 80. In some cases, at least part of the predefined baseline appliance profile for each of the plurality of predetermined appliance types may be learned using machine learning that is trained using one or more of voltage, current, power, and energy (and/or other electrical load parameter) sampled from a plurality of training appliances of the corresponding appliance type.

Figure 4:
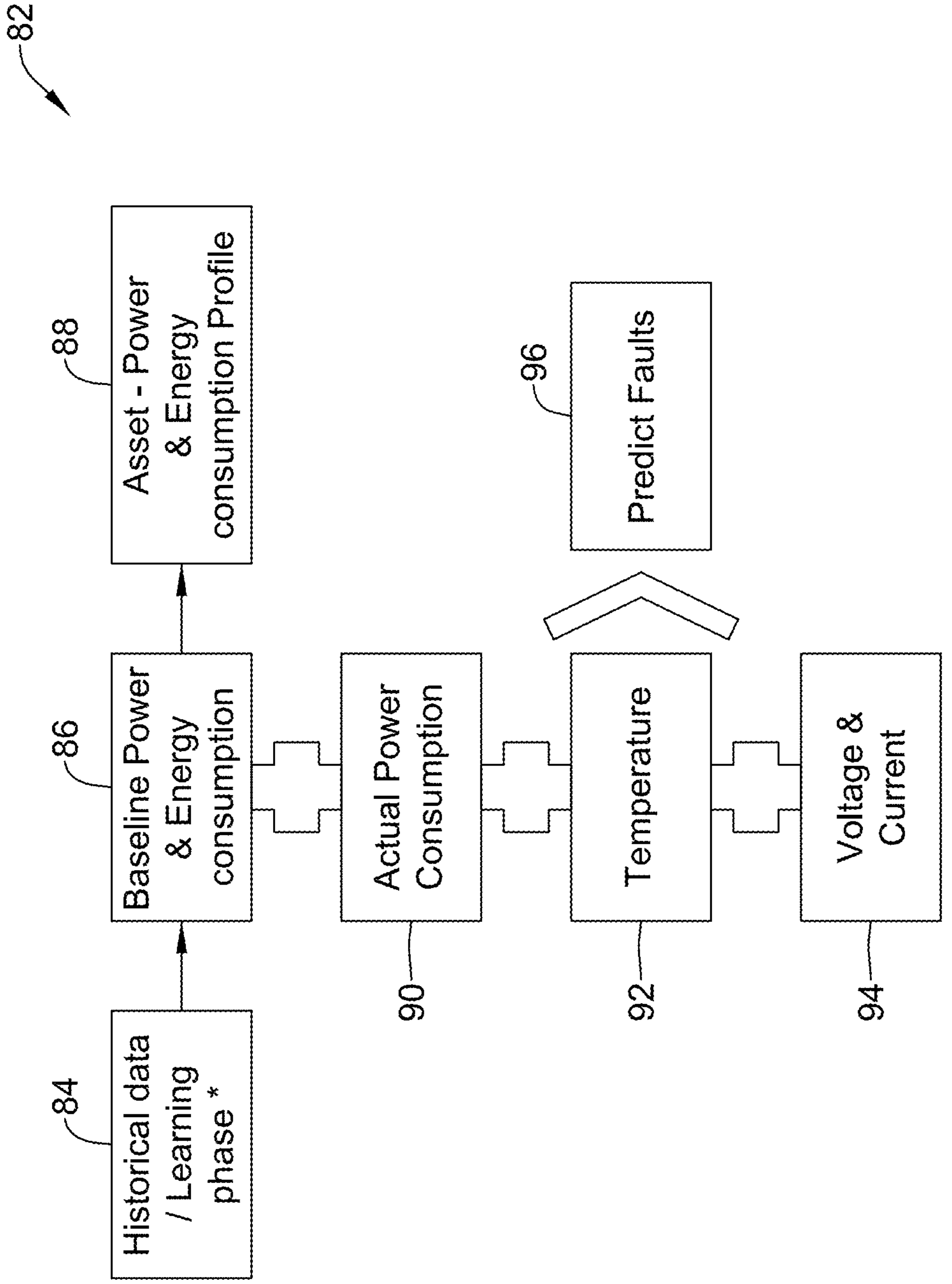
FIG. 4 is a flow diagram showing an illustrative flow diagram of detecting and/or predicting anomalous behavior in an appliance.

FIG. 4 is a flow diagram 82 of a series of steps for detecting and/or predicting anomalous behavior in an appliance. The series of steps includes collecting historical data during a learning phase, as indicated at block 84. A baseline power and energy consumption is established for the appliance based at least in part on the historical data collected during the learning phase, as indicated at block 86. A power and energy consumption profile is determined based on the established baseline power and energy consumption for the appliance, as indicated at block 88. These are used in combination with actual power consumption, as indicated at block 90, temperature, as indicated at block 92, and voltage and current, as indicated at block 94, collected from the socket during an operation phase to detect and/or predict faults, as indicated at block 96 for the appliance.

Figure 5A:
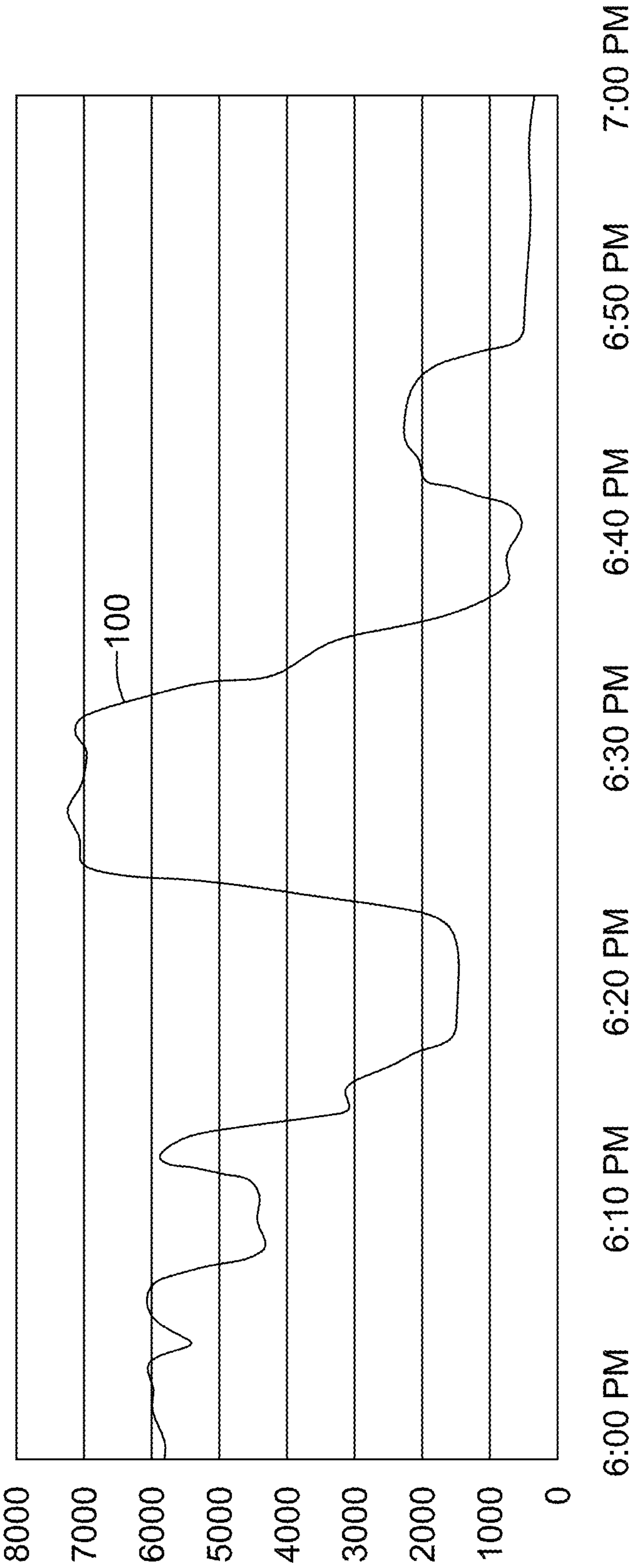
FIG. 5A is a graphical representation of cumulative energy consumption over time for a group of smart sockets.
Figure 5B:
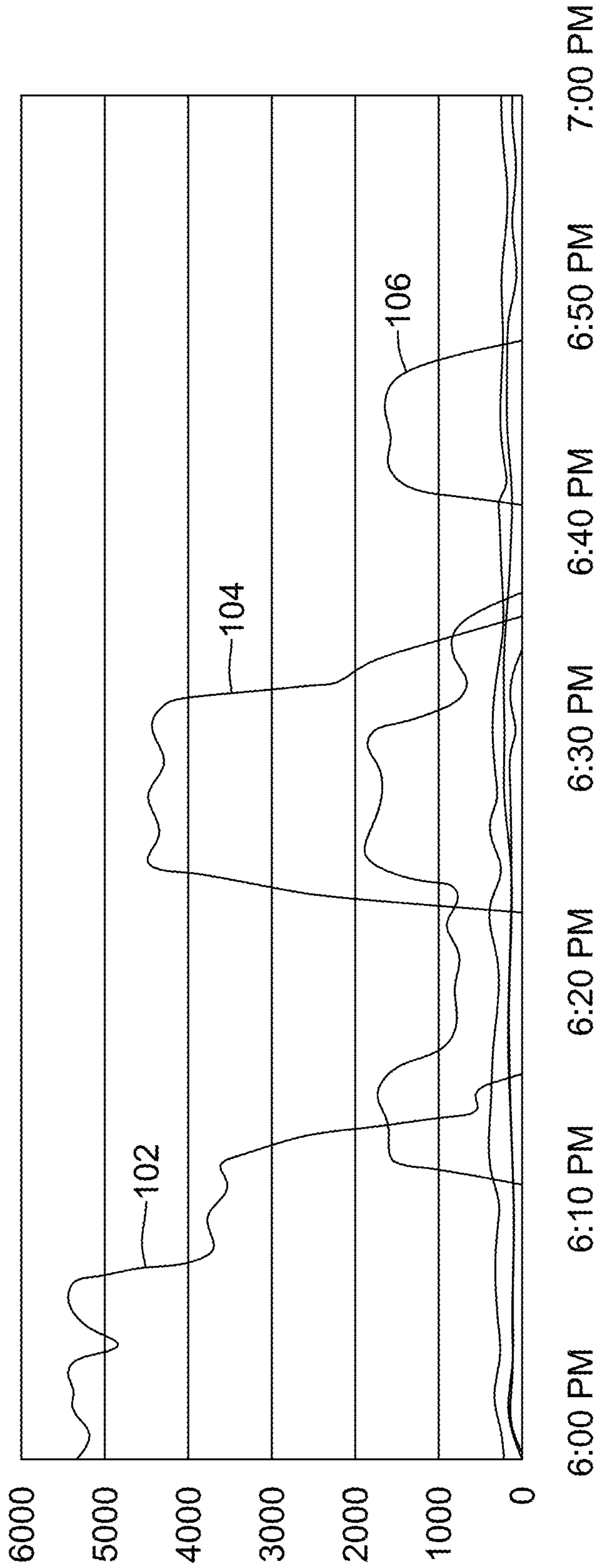
FIG. 5B is a graphical representation of energy consumption over time for each of a number of appliances that are plugged into each of the smart sockets of the group of smart sockets of FIG. 5A, showing how each individual appliance contributes to the cumulative energy consumption.

In some instances, machine learning may be used to identify each appliance that is connected to a smart socket, or to identify each of a number of appliances that are connected to a number of smart sockets. FIG. 5A is a graphical representation of cumulative energy consumption over time for a group of smart sockets, and FIG. 5B is a graphical representation of energy consumption over time for each of a number of appliances that are plugged into each of the smart sockets of the group of smart sockets of FIG. 5A, showing how each individual appliance contributes to the cumulative energy consumption. FIG. 5A includes a graphed line 100 that shows cumulative energy consumption over time (a one hour period, as shown) for a number of appliances connected to a number of sockets. In FIG. 5B, the cumulative energy consumption is broken down into energy consumption for each of a number of appliances. Early on, a majority of the energy is consumed by a dryer, as indicated by a graphed line 102. Near 6:30 pm, a majority of the energy is consumed by a dishwasher, as indicated by a graphed line 104. The next biggest energy consumer is a water heater, as indicated by a graphed line 106. Additional appliances such as a television (TV), lights and a set top box consume relatively lower amounts of energy.

Each of the energy curves shown in FIG. 5B are collected by one smart socket. The energy consumption curve (e.g. amplitude, time, shape) collected by a smart socket may be compared to a plurality of baseline energy consumption curves in a library of baseline energy consumption curves. When the energy consumption curve (e.g. amplitude, time, shape) collected by a smart socket matches one of the plurality of baseline energy consumption curves, the appliance that is connected to the smart socket may be classified with an appliance type that corresponds to the matching baseline energy consumption curve. In this way, the appliance type of the appliance that is connected to the smart socket may be automatically identified and reported to the supervisor 11.

Figure 6A:
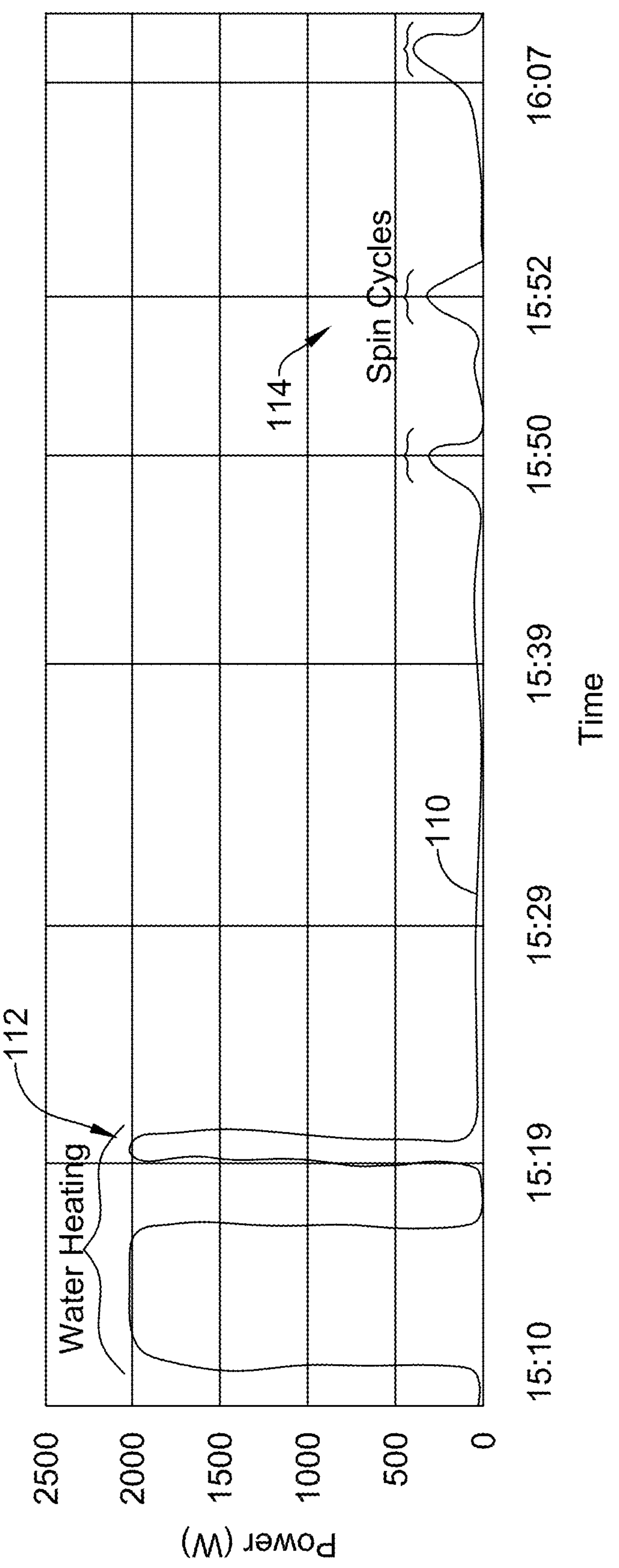
FIG. 6A is a graphical representation of expected energy consumption for a washing machine.
Figure 6B:
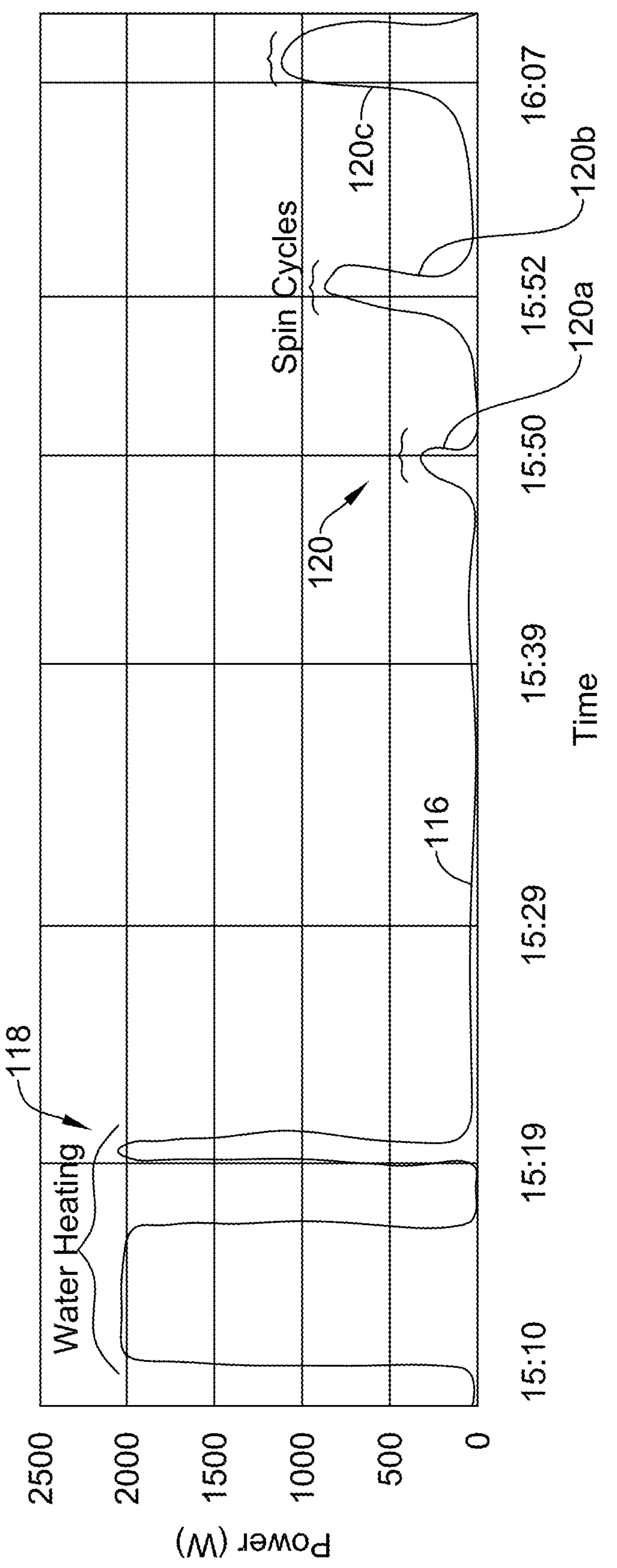
FIG. 6B is a graphical representation of actual energy consumption for a washing machine, showing one or more possible anomalies.

FIG. 6A is a graphical representation of expected energy consumption for a washing machine. and FIG. 6B is a graphical representation of actual energy consumption for the washing machine, showing one or more possible anomalies. In FIG. 6A, expected energy consumption is plotted versus time as a graphed line 110. The graphed line 110 exhibits several large peaks 112 in energy consumption that correspond to when the washing machine is actively heating water. During agitation, the energy consumption is lower. The graphed line 110 includes several smaller peaks 114 that correspond to spin cycles for the washing machine. In FIG. 6B, actual energy consumption collected by a smart socket is plotted versus time as a graphed line 116. The graphed line 116 exhibits several large peaks 118 that correspond to when the washing machine is actively heating water. The actual peaks 118 align well with the expected peaks 112 (FIG. 6A). During agitation, the energy consumption is lower. The graphed line 116 includes several smaller peaks 120 that correspond to spin cycles for the washing machine. However, in contrast with the expected spin cycle peaks 114, it can be seen that the spin cycle peaks 120, including a first peak 120*a*, a second peak 120*b* and a third peak 120*c*, are substantially greater in amplitude than the expected spin cycle peaks 114. This may indicate, for example, that the electric motor or a bearing that is associated with spinning the washing machine drum is wearing out.

Having thus described several illustrative embodiments of the present disclosure, those of skill in the art will readily appreciate that yet other embodiments may be made and used within the scope of the claims hereto attached. It will be understood, however, that this disclosure is, in many respects, only illustrative. Changes may be made in details, particularly in matters of shape, size, arrangement of parts, and exclusion and order of steps, without exceeding the scope of the disclosure. The disclosure's scope is, of course, defined in the language in which the appended claims are expressed.

What is claimed is:

1. A method for identifying anomalous behavior in an operation of an appliance that is plugged into a socket receptacle of a smart socket, wherein the smart socket includes a measurement unit that is configured to sample a current and a voltage delivered by the smart socket to the appliance, the method comprising:

during a learning time, identifying a baseline appliance profile for the appliance that is plugged into the socket receptacle of the smart socket, the baseline appliance profile is based at least in part on the current and the voltage, sampled by the measurement unit of the smart socket at each of a plurality of sample times during the learning time, and delivered by the smart socket to the appliance;

during an operational time subsequent to the learning time:

identifying an operational profile for the appliance, the operational profile is based at least in part on the current and the voltage, sampled by the measurement unit of the smart socket at each of a plurality of sample times during the operational time, and delivered by the smart socket to the appliance;

comparing the operational profile of the appliance to the baseline appliance profile;

detecting and/or predicting an anomalous behavior in the operation of the appliance based at least in part on the comparison of the operational profile of the appliance to the baseline appliance profile; and taking action in response to detecting and/or predicting the anomalous behavior in the operation of an appliance;

wherein the smart socket includes an in-built temperature sensor for sampling a temperature inside the smart socket, wherein the baseline appliance profile includes a baseline temperature profile that is based at least in part on the temperature inside the smart socket at each of a plurality of temperature sample times during the learning time correlated with the current and the voltage sampled by the measurement unit of the smart socket at one or more of the plurality of sample times during the learning time;

wherein the operational profile is based at least in part on the current and the voltage, sampled by the measurement unit of the smart socket at each of a plurality of sample times during the operational time, and delivered by the smart socket to the appliance, and an operational temperature profile that is based at least in part on the temperature inside the smart socket at each of a plurality of temperature sample times during the operational time and correlated with the current and the voltage sampled by the measurement unit of the smart socket at one or more of the plurality of sample times during the operational time; and wherein detecting and/or predicting the anomalous behavior in the operation of the appliance includes comparing the operational temperature profile, correlated with the current and the voltage sampled by the measurement unit of the smart socket at one or more of the plurality of sample times during the operational time, to the baseline temperature profile of the baseline appliance profile.

2. The method of claim 1, comprising:

determining a baseline energy consumption profile of the appliance that is plugged into the socket receptacle of the smart socket based at least in part on the current and the voltage, as sampled by the measurement unit of the smart socket at one or more of the plurality of sample times during the learning time, wherein the baseline appliance profile includes the baseline energy consumption profile of the appliance;

determining an operational energy consumption profile of the appliance based at least in part on the current and the voltage, as sampled by the measurement unit of the smart socket at one or more of the plurality of sample times during the operational time; and wherein detecting and/or predicting the anomalous behavior in the operation of the appliance is based at least in part on the comparison of the operational energy consumption profile of the appliance to the baseline energy consumption profile of the appliance.

3. The method of claim 1, comprising:

determining a baseline power consumption profile of the appliance that is plugged into the socket receptacle of the smart socket based at least in part on the current and the voltage, as sampled by the measurement unit of the smart socket at one or more of the plurality of sample times during the learning time, wherein the baseline appliance profile includes the baseline power consumption profile of the appliance;

determining an operational power consumption profile of the appliance based at least in part on the current and the voltage, as sampled by the measurement unit of the smart socket at one or more of the plurality of sample times during the operational time; and wherein detecting and/or predicting the anomalous behavior in the operation of the appliance is based at least in part on the comparison of the operational power consumption profile of the appliance to the baseline power consumption profile of the appliance.

4. The method of claim 1, comprising:

determining a baseline power factor profile of the appliance that is plugged into the socket receptacle of the smart socket based at least in part on the current and the voltage, as sampled by the measurement unit of the smart socket at one or more of the plurality of sample times during the learning time, wherein the baseline appliance profile includes the baseline power factor profile of the appliance;

determining an operational power factor profile of the appliance based at least in part on the current and the voltage, as sampled by the measurement unit of the smart socket at one or more of the plurality of sample times during the operational time; and wherein detecting and/or predicting the anomalous behavior in the operation of the appliance is based at least in part on the comparison of the operational power factor profile of the appliance to the baseline power factor profile of the appliance.

5. The method of claim 1, comprising:

classifying the appliance that is plugged into the socket receptacle of the smart socket into one of a plurality of predetermined appliance types, wherein classifying the appliance includes comparing the current and/or the voltage sampled by the measurement unit of the smart socket at one or more of the plurality of sample times during the learning time, and/or one or more measures derived at least in part from the current and/or the voltage sampled by the measurement unit of the smart socket at one or more of the plurality of sample times during the learning time, with each of a plurality of predetermined appliance profiles each associated with one of the plurality of predetermined appliance types to identifying a matching one of the plurality of predetermined appliance profiles; and using the matching one of the plurality of predetermined appliance profiles as the baseline appliance profile for the appliance that is plugged into the socket receptacle of the smart socket.

6. The method of claim 5, wherein each of the plurality of predetermined appliance profiles is learned using machine learning.

7. The method of claim 1, wherein the baseline appliance profile includes a power consumption signature of the appliance that is plugged into the socket receptacle of the smart socket.

8. The method of claim 1, wherein the baseline appliance profile includes an energy consumption signature of the appliance that is plugged into the socket receptacle of the smart socket.

9. The method of claim 1, wherein the baseline appliance profile includes a power factor signature of the appliance that is plugged into the socket receptacle of the smart socket.

10. The method of claim 1, wherein the measurement unit of the smart socket is configured to report one or more measures derived at least in part from the current and/or the voltage sampled by the measurement unit of the smart socket at one or more of the plurality of sample times during the learning time, and one or more measures derived at least in part from the current and/or the voltage sampled by the measurement unit of the smart socket at one or more of the plurality of sample times during the operational time.

11. The method of claim 1, comprising transmitting an alert to notify a user of the detected and/or predicted anomalous behavior in the operation of the appliance.

12. The method of claim 1, in response to the detected and/or predicted anomalous behavior in the operation of the appliance, turning off power to the socket receptacle of the smart socket and thus turning power off to the appliance that is plugged into the socket receptacle of the smart socket.

13. A method for identifying anomalous behavior in an operation of an appliance that is plugged into a socket receptacle of a smart socket, wherein the smart socket includes a measurement unit that is configured to sample one or more of voltage, current, power, and energy delivered by the smart socket to the appliance, the method comprising:

during a learning time:

monitoring one or more of voltage, current, power, and energy that is sampled by the measurement unit of the smart socket and delivered by the smart socket to the appliance that is plugged into the socket receptacle of the smart socket during at least part of the learning time, resulting in a monitored electrical behavior of the appliance;

based on the monitored electrical behavior of the appliance, classifying the appliance into one of a plurality of predetermined appliance types, wherein each of the plurality of predetermined appliance types has a corresponding predefined baseline appliance profile;

during an operation time:

monitoring one or more of voltage, current, power, and energy that is sampled by the measurement unit of the smart socket and delivered by the smart socket to the appliance that is plugged into the socket receptacle of the smart socket during at least part of the operational time, resulting in a monitored operational behavior;

comparing the monitored operational behavior of the appliance with the predefined baseline appliance profile that corresponds to the predetermined appliance type into which the appliance has been classified;

detecting and/or predicting an anomalous behavior in the appliance based at least in part on the comparison of the monitored operational behavior of the appliance with the predefined baseline appliance profile that corresponds to the predetermined appliance type into which the appliance has been classified; and taking action in response to detecting and/or predicting the anomalous behavior in the operation of an appliance.

14. The method of claim 13, wherein the plurality of predetermined appliance types include one or more of a clothes dryer, a clothes washer, a dishwasher, a light, a television, a freezer, a refrigerator, a garage door opener, a computer, a modem, and a printer.

15. The method of claim 13, wherein at least part of the predefined baseline appliance profile for each of the plurality of predetermined appliance types is learned using machine learning that is trained using one or more of voltage, current, power, and energy sampled from a plurality of training appliances of the corresponding appliance type.

16. A system for identifying anomalous behavior in an operation of an appliance that is plugged into a socket receptacle of a smart socket, wherein the smart socket includes a measurement unit that is configured identify an energy use of the appliance delivered by the smart socket to the appliance, the system comprising:

a memory for storing the identified energy use of the appliance delivered by the smart socket to the appliance;

a controller operatively coupled to the memory, the controller configured to:

detect an energy use pattern of the appliance based on the stored energy use identified by the measurement unit of the smart socket;

compare the energy use pattern to an expected energy use pattern for the appliance;

when the energy use pattern deviates from the expected energy use pattern for the appliance in accordance with one or more predetermined deviation criteria, detect and/or predict an anomalous behavior in an operation of an appliance; and take action in response to detecting and/or predicting the anomalous behavior in the operation of an appliance;

further wherein the controller is also configured to:

classify the appliance into a selected one of a plurality of appliance types based at least in part on the energy use pattern of the appliance, wherein each of the plurality of appliance types has a corresponding expected energy use pattern; and compare the energy use pattern of the appliance to the corresponding expected energy use pattern for the selected one of the plurality of appliance types and, when the energy use pattern deviates from the corresponding expected energy use pattern for the appliance in accordance with one or more predetermined deviation criteria, detect and/or predict an anomalous behavior in an operation of an appliance.

17. The system of claim 16, wherein the plurality of appliance types include one or more of a clothes dryer, a clothes washer, a dishwasher, a light, a television, a freezer, a refrigerator, a garage door opener, a computer, a modem, and a printer.

* * * * *